(12) United States Patent
Genz et al.

(10) Patent No.: US 6,387,771 B1
(45) Date of Patent: *May 14, 2002

(54) LOW TEMPERATURE OXIDATION OF CONDUCTIVE LAYERS FOR SEMICONDUCTOR FABRICATION

(75) Inventors: Oliver Genz; Alexander Michaelis, both of Wappingers Falls, NY (US)

(73) Assignee: Infineon Technologies AG, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/327,711

(22) Filed: Jun. 8, 1999

(51) Int. Cl.[7] .................... H01L 21/20; H01L 21/8242
(52) U.S. Cl. .................. 438/386; 438/243; 205/124; 216/41; 216/42; 216/43; 216/44; 216/47; 216/48; 216/49; 216/51
(58) Field of Search .............. 205/124, 41, 42, 205/43, 44, 47, 48, 49, 51; 438/243, 386

(56) References Cited

U.S. PATENT DOCUMENTS

| | | | | |
|---|---|---|---|---|
| 3,634,203 A | * | 1/1972 | McMahon | 204/15 |
| 3,971,710 A | * | 7/1976 | Romankiw | 204/15 |
| 4,146,440 A | * | 3/1979 | Thompson | 204/15 |
| 4,242,791 A | * | 1/1981 | Horng et al. | 29/578 |
| 4,261,792 A | * | 4/1981 | Tsuji et al. | 156/656 |
| 4,502,204 A | * | 3/1985 | Togashi et al. | 29/571 |
| 4,624,048 A | * | 11/1986 | Hinkel et al. | 29/603 |
| 4,648,937 A | * | 3/1987 | Ogura et al. | 156/643 |
| 5,549,931 A | | 8/1996 | Dattattraya et al. | 427/376.2 |
| 6,030,517 A | * | 2/2000 | Lincot et al. | 205/333 |

FOREIGN PATENT DOCUMENTS

| | | |
|---|---|---|
| DE | 2746225 | 8/1996 |
| DE | 19728473 | 1/1999 |
| JP | 59-094438 | 5/1984 |

* cited by examiner

*Primary Examiner*—John F. Niebling
*Assistant Examiner*—Jennifer M. Kennedy

(57) ABSTRACT

A method for forming a valve metal oxide for semiconductor fabrication in accordance with the present invention is disclosed and claimed. The method includes the steps of providing a semiconductor wafer, depositing a valve metal on the wafer, placing the wafer in an electrochemical cell such that a solution including electrolytes interacts with the valve metal to form a metal oxide when a potential difference is provided between the valve metal and the solution and processing the wafer using the metal oxide layer.

28 Claims, 9 Drawing Sheets

FIG. 5
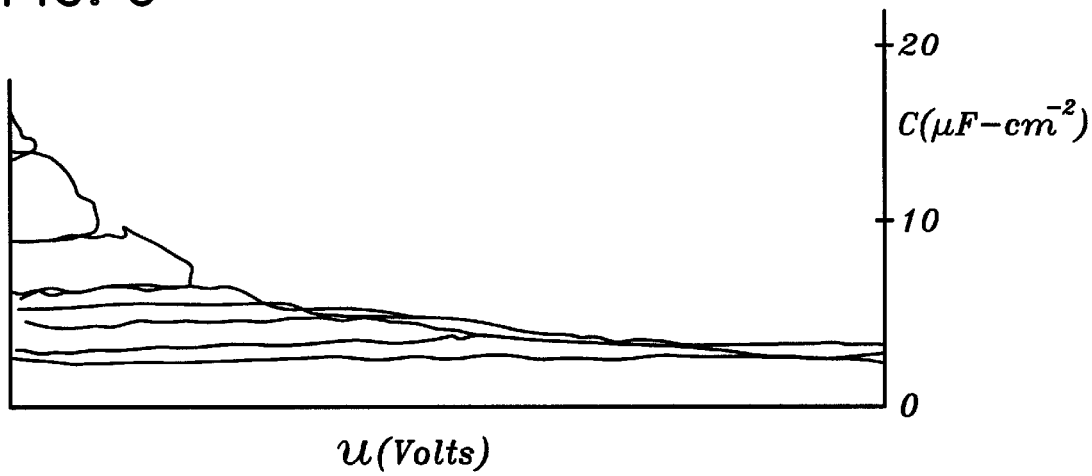
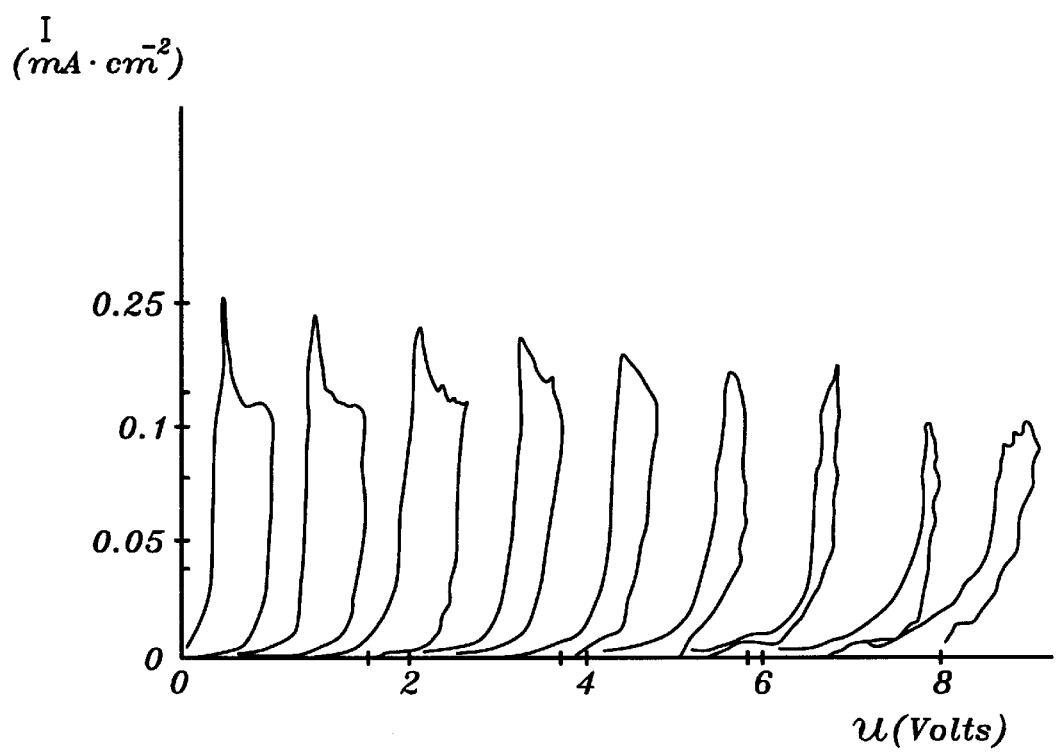
FIG. 6

LOW TEMPERATURE OXIDATION OF CONDUCTIVE LAYERS FOR SEMICONDUCTOR FABRICATION

BACKGROUND

1. Technical Field

This disclosure relates to semiconductor fabrication and more particularly, to etch hard masks formed by low temperature oxidation of metals.

2. Description of the Related Art

Trench formation in semiconductor fabrication is often limited by the capabilities of a mask used to form the trench or other component of a semiconductor wafer. To describe this in more detail, an illustrative example of deep trench etching is explained. Deep trenches are used to include a storage node for a deep trench capacitor. To increase the capacitance of a deep trench capacitor, it is advantageous to increase the surface area of the storage node. One way to do this is to increase a depth of the deep trench since the substrate which includes deep trenches can provide depth without impact to the layout area of the substrate. The deep trench (DT) etch depth is currently limited by mask erosion as explained below.

Referring to FIG. 1, a memory device 10 includes a substrate 12 having a pad stack 11 formed thereon. Substrate 12 is preferably a monocrystalline silicon substrate. Pad stack 11 includes an oxide layer 14 and a nitride layer 16. A hard mask layer 18 is deposited on pad stack 11. Hard mask 18 typically includes boron doped silicate glass (BSG). Hard mask 18 is patterned using lithographic techniques known to those skilled in the art to form holes 15 where deep trenches 17 will be formed. Formation of trench 17 is preferably formed by employing an anisotropic etch, such as a reactive ion etch (RIE).

Trench 17 is etched into substrate 12. During this process, however, hard mask 18 is eroded away which may cause collateral damage to areas adjacent to the position of trench 17. The longer etching occurs, the higher the risk of eroding away hard mask 18.

To increase the amount of time for etching, a thicker hard mask 18 may be used. However, this increases process time and does not necessarily provide a deeper trench.

Therefore, a need exists for a more economical hard mask employed for etching which has increased selectivity such that etching time is increased without significant erosion of the hard mask.

SUMMARY OF THE INVENTION

A method for forming a valve metal oxide for semiconductor fabrication in accordance with the present invention includes the steps of providing a semiconductor wafer, depositing a valve metal material on the wafer, placing the wafer in an electrochemical cell such that a solution including electrolytes interacts with the valve metal material to form a metal oxide when a potential difference is provided between the valve metal material and the solution and processing the wafer using the metal oxide layer.

A method for etching trenches in a semiconductor substrate, in accordance with the present invention, includes the steps of providing a semiconductor substrate, forming a pad stack of the substrate, depositing a valve metal material on the pad stack, placing the substrate in an electrochemical cell such that a solution including electrolytes interacts with the valve metal material to form a metal oxide when a potential difference is provided between the valve metal material and the solution, and employing the metal oxide as an etch mask for etching trenches into the substrate.

Another method for forming a valve metal oxide for semiconductor fabrication, in accordance with the present invention, includes the steps of providing a semiconductor wafer including a substrate having at least one layer formed thereon, depositing a dielectric layer on the at least one layer, depositing a valve metal material on the dielectric layer, oxidizing the valve metal material by placing the wafer in an electrochemical cell such that a solution including electrolytes interacts with the valve metal material to form a metal oxide when a potential difference is provided between the valve metal material and the solution, the dielectric layer for providing protection for the at least one layer during the oxidizing step, and processing the wafer using the metal oxide layer.

In alternate methods, the step of depositing a valve metal material may include depositing a valve metal material selected from the group consisting of aluminum, niobium, tantalum, titanium, titanium nitride, hafnium and zirconium. The method may include the step of applying a voltage between the valve metal material and the solution to create the potential difference such that the voltage applied controls the thickness of the metal oxide. The solution may include an acetate buffer in aqueous solution. The acetate buffer solution preferably has a pH of between about 4 and about 7. The step of placing the wafer in an electrochemical cell may include the steps of placing the wafer in an electrochemical cell such that the wafer has an exposed surface area of valve metal, and providing a counter electrode in the solution having a greater exposed surface area than the exposed surface area of the valve metal.

The step of placing the wafer in an electrochemical cell may include the step of sealing other than exposed areas of the valve metal material to prevent contact with the solution. The solution which includes electrolytes preferably interacts with the valve metal material to form the metal oxide at about room temperature. The step of processing the wafer using the metal oxide layer may include the step of employing the metal oxide layer as an etch mask and/or etch stop. The step of employing the metal oxide as an etch mask for etching trenches into the substrate may include the step of patterning the valve metal material to open holes at locations for the trenches. The step of employing the metal oxide as an etch mask for etching trenches into the substrate may include the step of patterning the metal oxide to open holes at locations for the trenches. The step of processing the wafer may include the step of patterning the valve metal material to open holes at locations for trenches to employ the metal oxide as an etch mask. The step of processing the wafer may include the step of patterning the metal oxide to open holes at locations for trenches to employ the metal oxide as an etch mask.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein:

FIG. 5 is a graph of capacitance C (charge storage) versus potential U for processing in accordance with the present invention;

FIG. 6 is a graph of current I versus potential U for processing in accordance with the present invention;

DETAILED DESCRIPTION OF PREFERRED EMBODIMENTS

The present invention relates to semiconductor fabrication and more particularly, to hard masks having improved selective etching capabilities. The hard masks in accordance with the present invention include metals, such as valve metals or other conductive compounds such as titanium nitride (TiN). For simplicity, valve metals will be considered to include theses other compounds as well. The valve metals are preferably oxidized by a low temperature oxidation method. In preferred embodiments, valve metal oxides, such as $Al_2O_3$, $TiO_2$, $Ta_2O_5$, $Nb_2O_6$, $ZrO_2$ and $HfO_2$ are employed. These oxides show high etch selectivity and may be formed by a more economically efficient method than prior art hard masks. A process for the formation of valve metal oxide hard masks at low temperature will now be described in greater detail.

Figure 1:
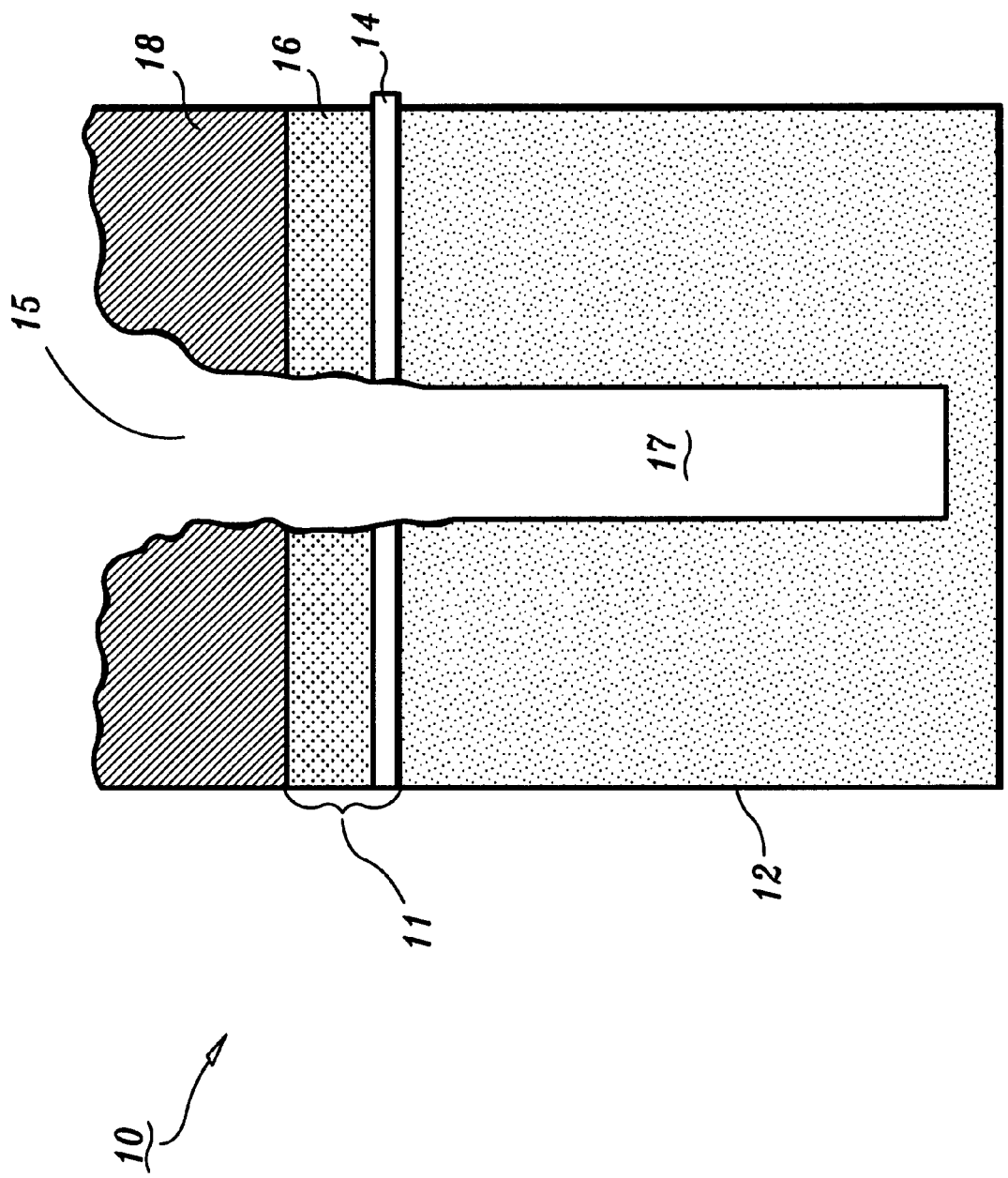
FIG. 1 is a cross-sectional view of a conventional semiconductor device showing erosion of a hard mask during trench etching.
Figure 2:
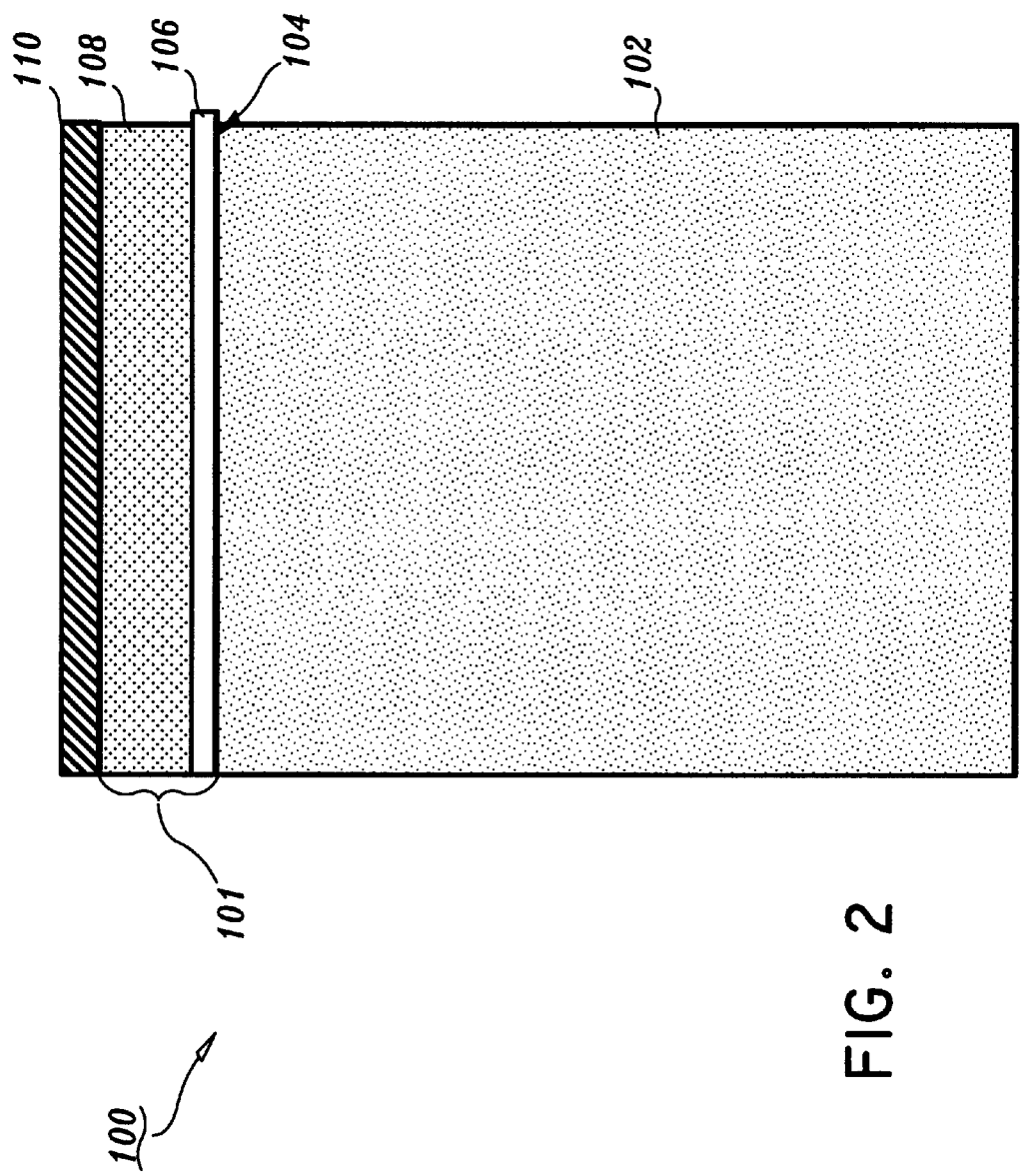
FIG. 2 is a cross-sectional view of a semiconductor device showing a valve metal material layer deposited thereon in accordance with the present invention.

Referring now in specific detail to the drawings in which like reference numerals identify similar or identical elements throughout the several views, and initially to FIG. 2, a semiconductor device 100 may include a memory device, such as, a dynamic random access memory (DRAM), synchronous DRAM, static RAMs, and read only memories or other memory integrated circuits. Device 100 may also include processor chips, logic circuits, application specific chips or the like. Device 100 and the following method will be illustratively described for the formation of deep trenches in semiconductor memories, however the invention is much broader and is applicable to any semiconductor device employing an etch mask or a layer of valve metal oxides for any process step.

Device 100 includes a substrate 102. Substrate 102 which may include a silicon material, although of substrate materials may be employed, for example, gallium arsenide, silicon-on-insulator, etc. A pad stack 101 is formed on a top surface 104 of substrate 102. Pad stack 101 may include an oxide layer 106 and a nitride layer 108. Other layers may be provided or multiple oxides and/or nitride layers may be employed.

In accordance with the present invention, a valve metal layer 110 is deposited on pad stack 101. Valve metal layer 110 may include one or more of aluminum (Al), titanium (Ti), tantalum (Ta), niobium (Nb), zirconium (Zr) and/or hafnium (Hf). Other conductive metal valve compounds may be used which form an oxide which is selectively etchable relative to substrate 102, for example TiN may be used. Valve metal layer 110 may be deposited using a chemical vapor deposition (CVD) process. Alternately, valve metal layer 110 may be deposited using a physical vapor deposition (PVD) process. Valve metal layer 110 may be deposited to a thickness of between about 10 nm and about 600 nm, preferably between about 100 nm and about 300 nm, although other thicknesses may be used.

Figure 3:
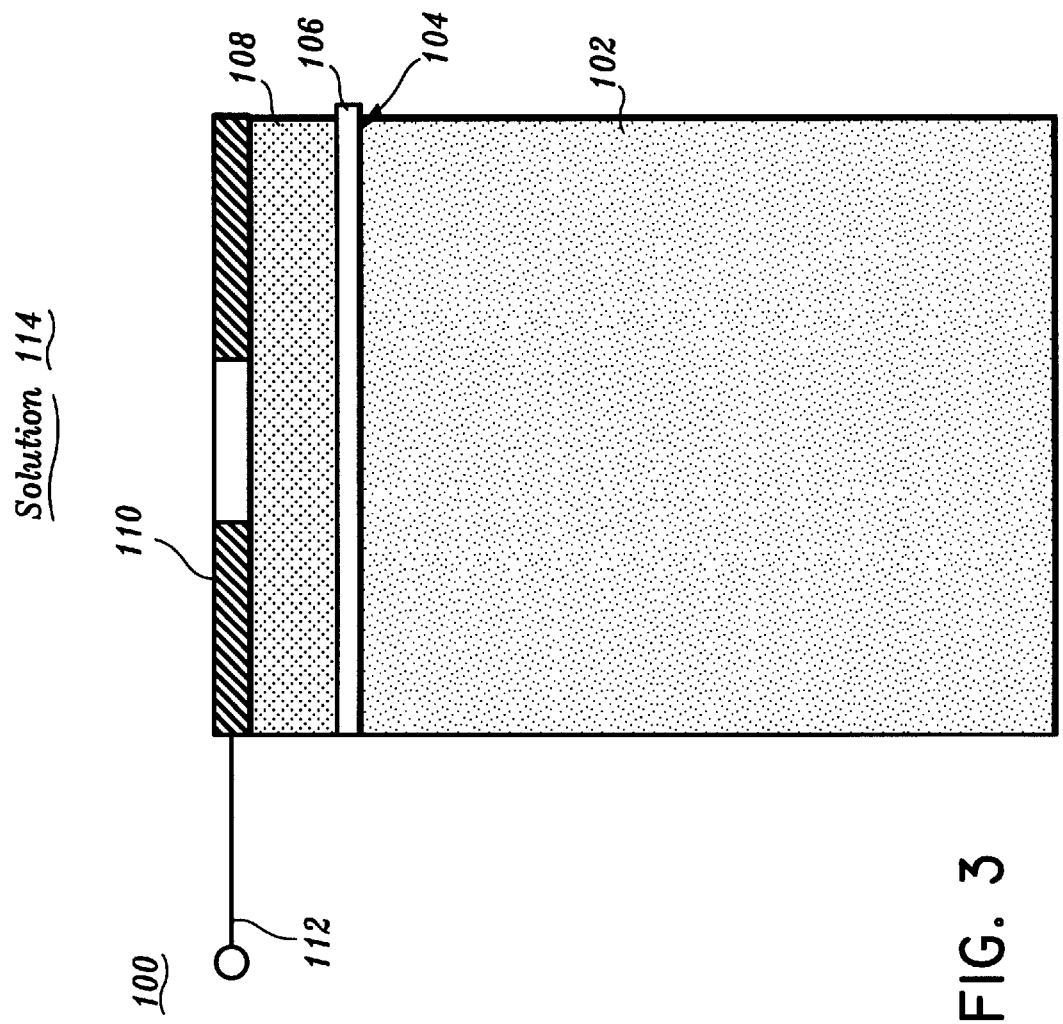
FIG. 3 is a cross-sectional view of the semiconductor device showing the valve metal material layer of FIG. 2 oxidized in accordance with the present invention, after the valve metal material layer is patterned.

Valve metal layer 110 may be patterned at this point or oxidized and then patterned. In either case, the oxide or metal is removed in accordance with a lithographic pattern and by lithography techniques known to those skilled in the art. For convenience, the case where valve metal layer 110 is patterned prior to oxidation is shown in FIG. 3. Patterning valve metal layer 110 prior to oxidation is preferred since layer 110 can be selectively etched relative to a lithographic resist layer. The resist layer (not shown) has a selectivity to layer 110 which is sufficient to open layer 110 having a thickness of about 600 nm, using a reactive ion etch (RIE). Other layer thicknesses may be used as well. This corresponds to a hard mask open process. By patterning layer 110 in this way, layer 110 is easily patterned due to the selectivity of the metal layer to the resist. The resist layer is then removed.

Figure 7:
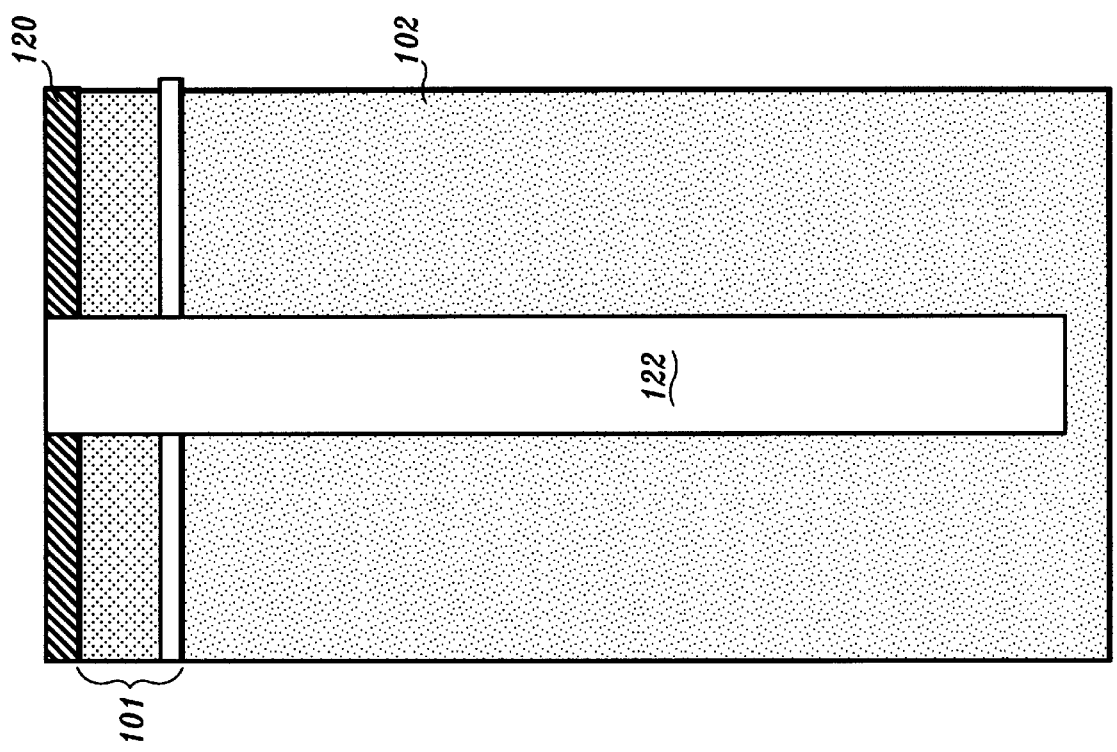
FIG. 7 is a cross-sectional view of the semiconductor device of FIG. 3 showing the oxidized valve metal layer functioning as an etch mask in accordance with the present invention.

Referring to FIG. 3, patterned valve metal layer 110 is now oxidized by a low temperature oxidation process in accordance with the invention to form a metal oxide layer 120 (FIG. 7). An electrode 112 is connected to valve metal layer 110 (or alternately substrate 102 if an appropriate conductive path exists between substrate 102 and valve metal 110), and device 100 is exposed to an electrolyte solution 114. Valve metals and their compounds may be oxidized anodically, in accordance with the invention, to form uniform oxide films. Advantageously, valve metal oxide electrochemical reaction permits current flow in one direction only, i.e. toward oxide formation. A stationary film thickness d is determined by an applied potential U according to a high field model as:

$$d=k(U-U_{ox}) \qquad \text{EQ. 1}$$

where the film formation factor k and the oxide formation potential $U_{ox}$ depend on experimental conditions which may include an electrolyte used, the pH of the solution and/or the valve metal used. Valve metal layer 110 is oxidized at about room temperature although other temperatures may be employed to achieve different results. The oxidation process is well controlled and results in uniform oxidation. The controlled oxidation can be achieved with the apparatus shown in FIG. 4. The process converts metals and metal compounds (TiN) to oxides. Theses oxides are now useful as hardmasks since they provide exceptional resistance to reactive ion etching processes which follow.

Figure 4:
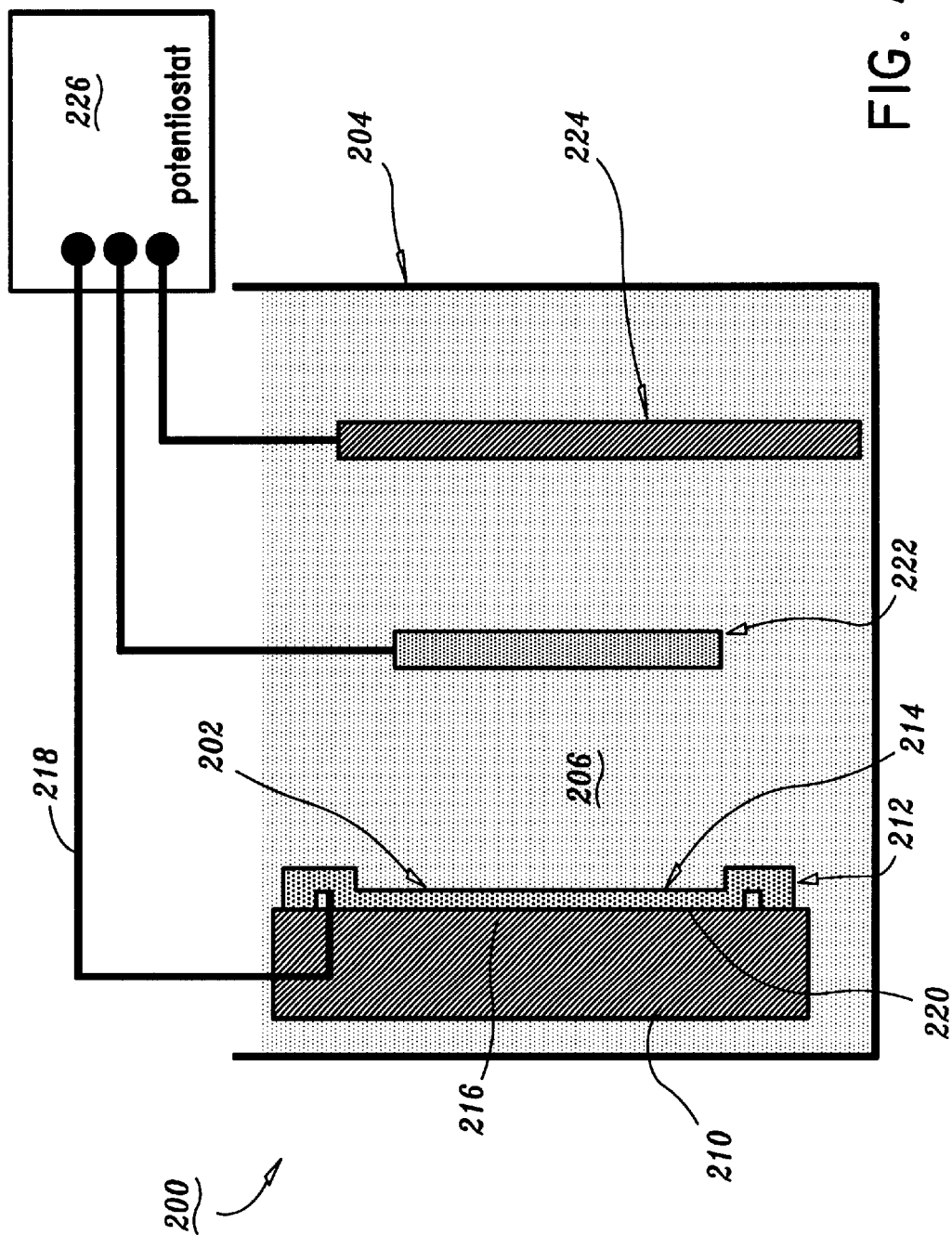
FIG. 4 is a schematic diagram of an apparatus for electrochemically forming a valve metal oxide in accordance with the present invention.

Referring to FIG. 4, an apparatus 200 is shown for applying a voltage for controlling electrochemical oxide formation on a wafer 202 having a device 100 thereon in accordance with the present invention. Apparatus 200 is an electrochemical cell which includes a bath 204 which is filled with a liquid 206 including an electrolyte. Liquid 206 is preferably water and the electrolyte may include ionic compounds such as salts, acid compounds, base compounds, etc. or a combination thereof. In one embodiment, the electrolyte includes an acetic buffer having a pH concentration of between about 4 and about 7. Other compounds and concentrations are contemplated and may be provided such that ions are capable of transfer between electrodes in bath 204.

Device 100, which is preferably included on semiconductor wafer 202, is secured to an isolating wafer holder 210. Clamps 212 are provided about a periphery of wafer 202 to both secure and seal wafer 202 such that only an upper face 214 of device 100 is exposed to solution 206 in bath 204. Electrical contact is made to device 100 on a backside 216 through a conductive wire 218 or to valve metal layer 110 directly, if insulating layers exist between substrate 102 and valve metal layer 110, such as in the case described above.

A conductive film or foil 220 may be disposed between a non-conductive or isolating wafer holder 210 and wafer 202 to improve electrical contact between wire 218 and wafer 202. A reference electrode 222 is included in bath 204 to maintain a predefined potential in solution 206 (also labeled as solution 114 in FIGS. 3 and 9). Reference electrode 222 maintains a defined potential on device 100, which preferably is a chip or wafer. A counter electrode 224 is also included. Counter electrode 224 preferably includes at least the same amount of exposed surface area as device 100. Preferably, counter electrode 224 is large versus the surface of device 100. That is, the surface area of counter electrode 224 is about 1.5 to about 50 times the surface area of valve metal layer 110. Counter electrode 224 preferably includes a noble metal (such as, gold (Au) or platinum (Pt)) or, to minimize contamination concerns, counter electrode 224 preferably includes the same metal that has to be oxidized on the wafer, i.e., the metal of valve metal layer 110. The optimum conditions for the electrolyte will depend on the respective valve metal.

A voltage source or potentiostat 226 is included for providing a voltage difference between device 100 and reference electrode 222. This voltage difference is used to control the thickness of oxide formed on device 100 as described above. The wafer with device 100 needs to be immersed into electrolyte solution 206. The potential is gradually raised to a target potential, which is needed for the desired film thickness and maintained at that potential for a defined period of time. The oxidation current and thus the charge can be monitored in-situ. When a particular value of the total charge has been transferred, the oxidation is complete. The quantities of charge needed to establish a given oxide thickness depends on the metal used. FIGS. 5–6 illustratively show current-voltage behavior of valve metals, for example, Al, Ta, Nb, Hf, Ti and Zr in an electrolyte solution, such as, an acetate buffer with a pH of 5.9. Using diagrams similar to these, a charge/current versus voltage relationship may be achieved. A voltage is thereby set for a predetermined amount of time to achieve a desired oxide thickness in accordance with the present invention. FIG. 6 shows a current I caused by potential U. FIG. 5 shows capacitance C versus potential U. Using FIGS. 5 and 6 and EQ. 1, a thickness for a valve metal oxide may be determined for a given potential or current, and an amount of time needed to provide a metal oxide of a given thickness may be determined. By monitoring the electrical characteristics of the electrochemical reaction, properties of the metal oxide layer may be determined, for example, oxide layer thickness, lateral expansion of the metal oxide layer, etc. Advantageously, this information may eliminate the need for making physical measurements of the metal oxide layer formed in accordance with the invention. After extracting the wafer with device 100 from solution 206 the remaining electrolyte has to be removed with deionized water.

Referring to FIG. 7, etching substrate 102 is now performed using a valve metal oxide layer 120. Layer 120 provides high etch resistance and high etch selectivity to silicon (substrate 102) so that a trench 122 may be formed. Valve metal oxide layer 120 may preferably include, $Al_2O_3$, $TiO_2$, $Ta_2O_5$, $Nb_2O_6$, $ZrO_2$ and $HfO_2$. Other oxides may be formed in accordance with the invention as well. The high etch resistance and high etch selectivity of the valve metal oxide layer 120 provides a longer etch time for reactive ion etching (or other etching process). In the illustrative example involving deep trench formation, the longer etch time provides the capability of etching deeper trenches without the concern for erosion. Processing may now continue as is known in the art.

Figure 8:
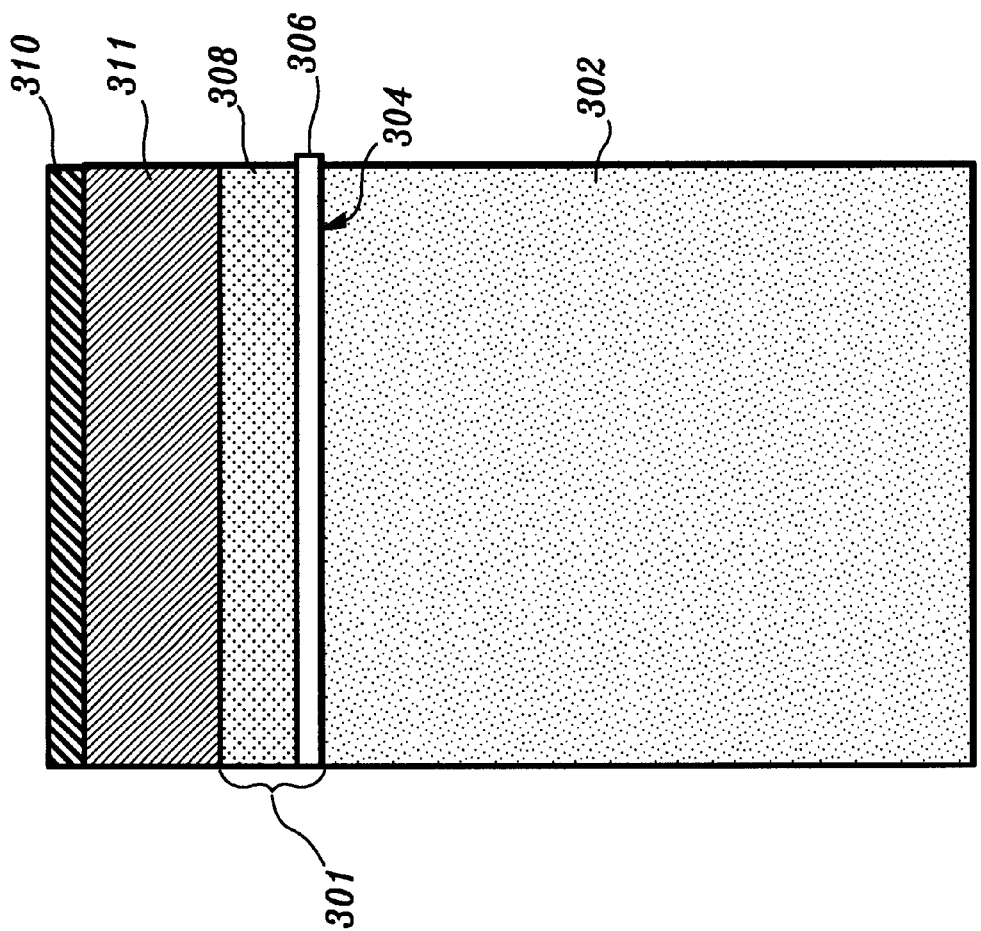
FIG. 8 is a cross-sectional view of a semiconductor device showing a valve metal material layer deposited on a protective dielectric layer in accordance with the present invention.

Referring to FIG. 8, an alternate embodiment includes a device 300 which includes a substrate 302. Substrate 302 which may include a silicon material, although of substrate materials may be employed. A pad stack 301 is formed on a top surface 304 of substrate 302. Pad stack 301 may include an oxide layer 306 and a nitride layer 308. Other layers may be provided or multiple oxide and/or nitride layers may be employed.

In accordance with the present invention, a dielectric layer 311 may be deposited over pad stack 301. Dielectric layer 301 may include an oxide, such as boron silicate glass (BSG) or other material which is selectively removable relative to the top layer of pad stack 301. Dielectric layer 311 is provided to protect pad stack 301 or other components of device 300 during anodic oxidation in later steps. Dielectric layer 311 includes a thickness sufficient to prevent over oxidation. A valve metal layer 310 is deposited on dielectric layer 311. Valve metal layer 310 may be deposited using a chemical vapor deposition (CVD) process or a physical vapor deposition (PVD) process as described above.

Valve metal layer 310 may be patterned at this point or oxidized and then patterned. In either case, the oxide or metal is removed in accordance with a lithographic pattern and by lithography techniques known to those skilled in the art. The case where the valve metal layer 310 is patterned after oxidation is shown in FIG. 9.

Figure 9:
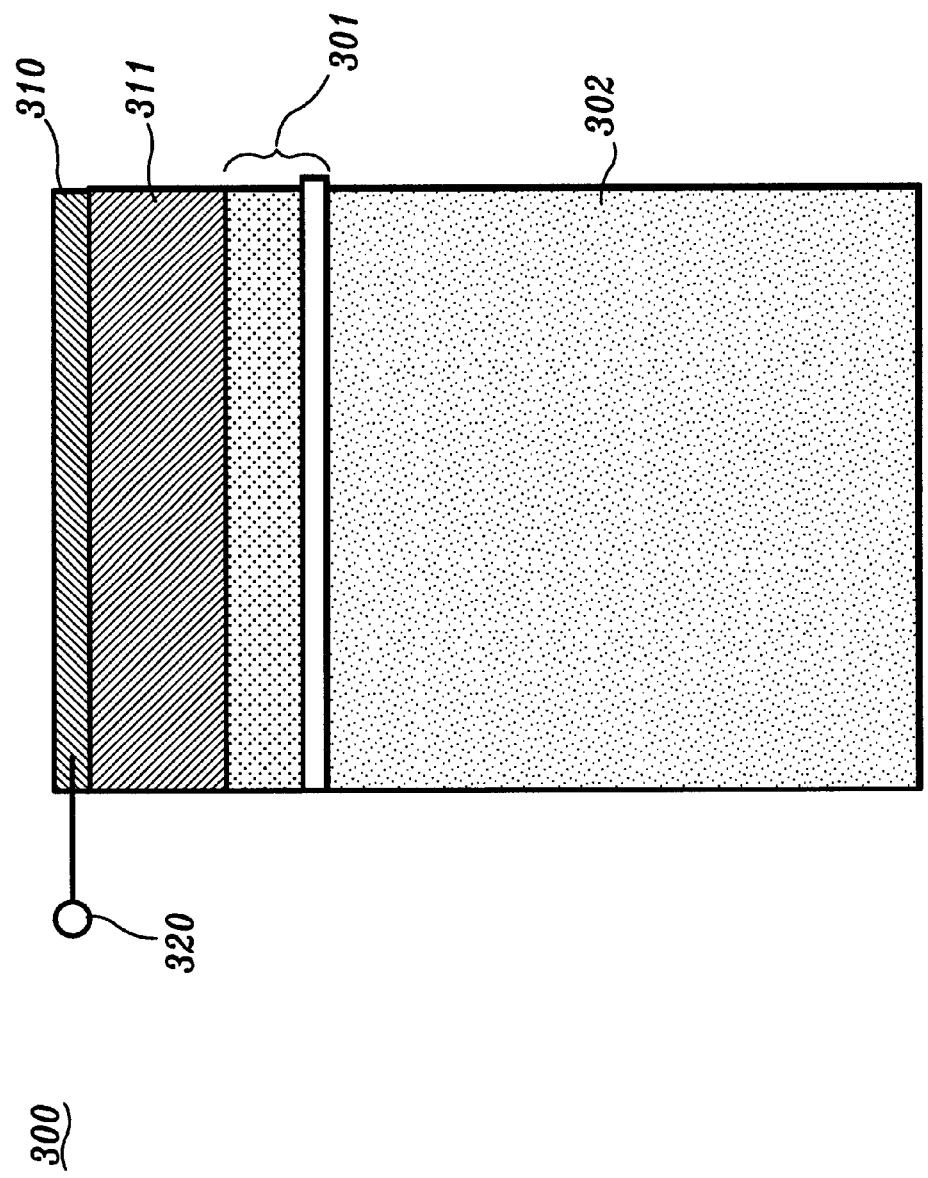
FIG. 9 is a cross-sectional view of the semiconductor device showing the valve metal material layer of FIG. 8 oxidized in accordance with the present invention, before the oxidized metal layer is patterned.

Referring to FIG. 9, layer 310 is oxidized by a low temperature oxidation process as described above with reference to FIG. 4. An electrode 320 is connected to valve metal layer 310 or to substrate 302. Valve metal layer 310 may be permitted to make contact to substrate 302 in some locations, thereby permitting electrode 320 to be connected to substrate 302. Layer 310 is completely oxidized to form a layer 322 (FIG. 10) which is a valve metal oxide layer.

Figure 10:
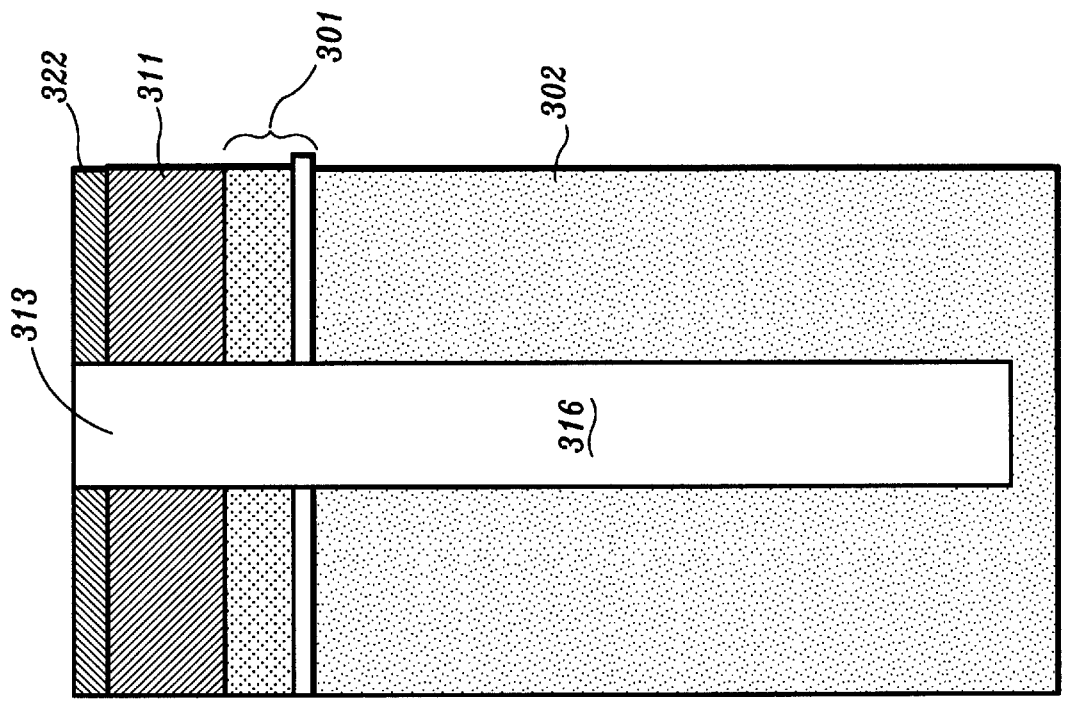
FIG. 10 is a cross-sectional view of the semiconductor device of FIG. 9 showing the oxidized metal layer functioning as an etch mask in accordance with the present invention.

Referring to FIG. 10, valve metal oxide layer 310 has been patterned using a resist (not shown) as described above. Layer 322 may be etched by dry etch process such as a RIE process selective to the resist. Openings 313 are formed through a valve metal oxide layer 322. Etching of trenches 316 is now performed. In accordance with the invention, deeper trenches 316 are capable of being formed since the valve metal oxide provides superior etch resistance to RIE. Processing may now continue as is known in the art.

Advantageously, the present provides a method for forming hardmasks without expending thermal budget. The present invention forms the oxide compounds at about room temperature. The thermal formation of these valve metal oxide films would normally require working at fairly high temperatures of several hundred degrees Celsius. Valve metal oxide layers may be removed using a wet etch process, for example.

The present invention provides a uniform and dense (pin hole free) valve metal oxide film on a wafer by anodic oxidation of the respective metal films before or after structuring. Some of the advantages over thermal oxidation include:

1) low thermal budget;
2) easy control of the oxide thickness by the applied potential;
3) in-situ monitoring of the thickness by measuring charge consumption in apparatus 200 of the oxidation process;
4) easy control of lateral expansion of the metal oxide due to oxidation along the surface of device 100 or 300 by measuring charge consumption in apparatus 200 of the oxidation process;
5) stress reduction in the metal oxide film can be achieved by working at room temperature and by careful control of the potential; and
6) easier and cheaper equipment set up and testing with less contamination concerns.

The present invention, may be employed for etching trenches, protecting components or numerous other applications. For example, a valve metal oxide layer may be formed as a mask for dopant implantation or as a stop layer for etching or polishing.

Having described preferred embodiments for low temperature oxidation of valve metals for semiconductor fabrication (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for forming a valve metal oxide for semiconductor fabrication comprising the steps of:
   providing a semiconductor wafer;
   depositing a valve metal material on the wafer;
   patterning the valve metal;
   after patterning the valve metal, placing the wafer in an electrochemical cell such that a solution including electrolytes interacts with the valve metal material to form a metal oxide when a potential difference is provided between the valve metal material and the solution; and
   processing the wafer using the metal oxide layer as an etch mask for patterning structures underlying the valve metal.

2. The method as recited in claim 1, wherein the step of depositing a valve metal material includes depositing a valve metal material selected from the group consisting of aluminum, niobium, tantalum, titanium, titanium nitride, hafnium and zirconium.

3. The method as recited in claim 1, further comprising the step of applying a voltage between the valve metal material and the solution to create the potential difference such that the voltage applied controls the thickness of the metal oxide.

4. The method as recited in claim 1, wherein the solution includes an acetate buffer in aqueous solution.

5. The method as recited in claim 4, wherein the acetate buffer solution has a pH of between about 4 and about 7.

6. The method as recited in claim 1, wherein the step of placing the wafer in an electrochemical cell includes the steps of:
   placing the wafer in an electrochemical cell such that the wafer has an exposed surface area of valve metal material; and
   providing a counter electrode in the solution having a greater exposed surface area than the exposed surface area of the valve metal.

7. The method as recited in claim 6, wherein the step of placing the wafer in an electrochemical cell includes the step of sealing other than exposed areas of the valve metal material to prevent contact with the solution.

8. The method as recited in claim 1, wherein the solution including electrolytes interacts with the valve metal material to form the metal oxide at about room temperature.

9. A method for etching trenches in a semiconductor substrate comprising the steps of:
   providing a semiconductor substrate;
   forming a pad stack of the substrate;
   depositing a valve metal material on the pad stack;
   patterning the valve metal material;
   placing the substrate in an electrochemical cell such that a solution including electrolytes interacts with the patterned valve metal material to form a metal oxide when a potential difference is provided between the patterned valve metal material and the solution; and
   employing the metal oxide as an etch mask for etching trenches into the substrate.

10. The method as recited in claim 9, wherein the step of depositing a valve metal material includes depositing a valve metal material selected from the group consisting of aluminum, niobium, tantalum, titanium, titanium nitride, hafnium and zirconium.

11. The method as recited in claim 9, further comprising the step of applying a voltage between the valve metal material and the solution to create the potential difference such that the voltage applied controls the thickness of the metal oxide.

12. The method as recited in claim 9, wherein the solution includes an acetate buffer in aqueous solution.

13. The method as recited in claim 9, wherein the acetate buffer solution has a pH of between about 4 and about 7.

14. The method as recited in claim 9, wherein the step of placing the wafer in an electrochemical cell includes the steps of:
   placing the wafer in an electrochemical cell such that the wafer has an exposed surface area of valve metal; and
   providing a counter electrode in the solution having a greater exposed surface area than the exposed surface area of the valve metal.

15. The method as recited in claim 14, wherein the step of placing the wafer in an electrochemical cell includes the step of sealing other than exposed areas of the valve metal material to prevent contact with the solution.

16. The method as recited in claim 9, wherein the solution including electrolytes interacts with the valve metal material to form the metal oxide at about room temperature.

17. The method as recited in claim 9, wherein the step of employing the metal oxide as an etch mask for etching trenches into the substrate includes the step of patterning the valve metal material to open holes at locations for the trenches.

18. The method as recited in claim 9, wherein the step of employing the metal oxide as an etch mask for etching trenches into the substrate includes the step of patterning the metal oxide to open holes at locations for the trenches.

19. A method for forming a valve metal oxide for semiconductor fabrication comprising the steps of:

provide a semiconductor wafer including a substrate having at least one layer formed thereon;

depositing a dielectric layer on the at least one layer;

depositing a valve metal material on the dielectric layer;

patterning the valve metal material;

oxidizing the patterned valve metal material by placing the wafer in an electrochemical cell such that a solution including electrolytes interacts with the patterned valve metal material to form a metal oxide when a potential difference is provided between the patterned valve metal material and the solution, the dielectric layer for providing protection for the at least one layer during the oxidizing step; and patterning structures underlying the patterned valve metal using the metal oxide layer as an etch mask.

20. The method as recited in claim 19, wherein the step of depositing a valve metal material includes depositing a valve metal material selected from the group consisting of aluminum, niobium, tantalum, titanium, titanium nitride, hafnium and zirconium.

21. The method as recited in claim 19, further comprising the step of applying a voltage between the valve metal material and the solution to create the potential difference such that the voltage applied controls the thickness of the metal oxide.

22. The method as recited in claim 19, wherein the solution includes an acetate buffer in aqueous solution.

23. The method as recited in claim 22, wherein the acetate buffer solution has a pH of between about 4 and about 7.

24. The method as recited in claim 19, wherein the step of oxidizing the valve metal material by placing the wafer in an electrochemical cell includes the steps of:

placing the wafer in an electrochemical cell such that the wafer has an exposed surface area of valve metal material; and providing a counter electrode in the solution having a greater exposed surface area than the exposed surface area of the valve metal material.

25. The method as recited in claim 24, wherein the step of placing the wafer in an electrochemical cell includes the step of sealing other than exposed areas of the valve metal material to prevent contact with the solution.

26. The method as recited in claim 19, wherein the solution including electrolytes interact with the valve metal material to form the metal oxide at about room temperature.

27. The method as recited in claim 19, wherein the step of patterning structures includes the step of patterning the substrate using the valve metal material to etch trenches in the substrate.

28. The method as recited in claim 19, wherein the step of patterning structures includes the step of patterning the substrate using the metal oxide to etch trenches in the substrate.

* * * * *